United States Patent
Yamakawa et al.

(10) Patent No.: US 10,163,672 B2
(45) Date of Patent: Dec. 25, 2018

(54) SUBSTRATE PROCESSING DEVICE, METHOD FOR CONTROLLING SUBSTRATE PROCESSING DEVICE, AND STORAGE MEDIUM STORING PROGRAMS

(71) Applicant: EBARA CORPORATION, Tokyo (JP)

(72) Inventors: Junitsu Yamakawa, Tokyo (JP); Takuya Tsushima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/684,365

(22) Filed: Aug. 23, 2017

(65) Prior Publication Data

US 2018/0286730 A1  Oct. 4, 2018

(30) Foreign Application Priority Data

Mar. 30, 2017 (JP) .................. 2017-067804

(51) Int. Cl.
| | |
|---|---|
| *H01L 21/68* | (2006.01) |
| *C25D 17/00* | (2006.01) |
| *G01B 11/00* | (2006.01) |
| *C25D 17/06* | (2006.01) |
| *C25D 21/12* | (2006.01) |

(52) U.S. Cl.
CPC .......... *H01L 21/681* (2013.01); *C25D 17/001* (2013.01); *C25D 17/06* (2013.01); *C25D 21/12* (2013.01); *G01B 11/002* (2013.01)

(58) Field of Classification Search
CPC ............................ C25D 17/001; H01L 21/681
See application file for complete search history.

(56) References Cited

U.S. PATENT DOCUMENTS

| | | | |
|---|---|---|---|
| 6,452,503 B1* | 9/2002 | Weiss ............... | H01L 21/67265 340/673 |
| 2003/0185664 A1* | 10/2003 | Mitsui ................. | H01L 21/681 700/245 |
| 2004/0004723 A1* | 1/2004 | Seko ....................... | G01B 9/02 356/498 |
| 2010/0118508 A1* | 5/2010 | Okada ................ | G01N 21/8806 362/3 |
| 2012/0009051 A1* | 1/2012 | Ruth ...................... | B65G 47/22 414/783 |
| 2012/0100709 A1 | 4/2012 | Minami | |
| 2013/0148878 A1* | 6/2013 | Lin .................. | H01L 21/67092 382/151 |
| 2015/0009498 A1* | 1/2015 | Zell ........................ | G01B 11/27 356/399 |

(Continued)

FOREIGN PATENT DOCUMENTS

| | | |
|---|---|---|
| JP | 2003-017545 A | 1/2003 |
| JP | 2014-053343 A | 3/2014 |
| JP | 5750327 B2 | 5/2015 |

*Primary Examiner* — Thomas Randazzo
(74) *Attorney, Agent, or Firm* — Baker & Hostetler LLP

(57) ABSTRACT

A substrate processing device for processing a substrate, comprising: an image sensor for detecting positions of two corners on at least one diagonal line of a substrate when the substrate is moved to a predetermined position; an illuminating device that can be disposed so as to illuminate the two corners of the substrate on an opposite side of the substrate at the predetermined position to the image sensor; and a control device for determining the position of the substrate, based on the positions of the two corners detected by the image sensor.

13 Claims, 18 Drawing Sheets

(56) References Cited

U.S. PATENT DOCUMENTS

| | | | |
|---|---|---|---|
| 2015/0044786 A1* | 2/2015 | Huang | H01L 24/94 438/14 |
| 2015/0069421 A1* | 3/2015 | Farooq | H01L 22/12 257/80 |
| 2015/0176980 A1* | 6/2015 | Jensen | H01L 21/681 356/614 |
| 2015/0179530 A1* | 6/2015 | Pass | H01L 31/18 438/7 |
| 2017/0047225 A1* | 2/2017 | Suga | B23K 20/00 |
| 2018/0094921 A1* | 4/2018 | Baggett | G01B 11/272 |

* cited by examiner

SUBSTRATE PROCESSING DEVICE, METHOD FOR CONTROLLING SUBSTRATE PROCESSING DEVICE, AND STORAGE MEDIUM STORING PROGRAMS

CROSS-REFERENCE TO RELATED APPLICATION

This application is based upon and claims benefit of priority from Japanese Patent Application No. 2017-067804 filed on Mar. 30, 2017, the entire contents of which are incorporated herein by reference.

TECHNICAL FIELD

The present invention relates to a substrate processing device, a method for controlling the substrate processing device, and a storage medium storing a program for executing the method for controlling the substrate processing device on a computer.

BACKGROUND TECHNOLOGY

There are plating devices that plate substrates held on a substrate holder. With such a plating device, substrates may be displaced from their proper position when they are mounted on and/or dismounted from the substrate holder. Such displacement of a substrate could be caused, for example if the substrate holder, the table on which the substrate holder is mounted, or the substrate is warped or if the substrate holder is tilted by droplets present on a surface of the substrate or dust on the table. The displacement in position creates the possibility that a plating process may not be properly performed on a workpiece to be plated, that is, the substrate.

There have been proposed techniques for detecting the position of a substrate when it is mounted on the substrate holder and correcting the position of the substrate if it is out of proper position (for example, Japanese Patent No. 5750327 (Patent Literature 1)). According to the technique described in Japanese Patent No. 5750327 (Patent Literature 1), a securing/retaining member 15 of a substrate holder 110 is provided with a notch 17 at a position corresponding to an edge of a substrate 500, and a laser sensor 1140 is disposed so that when the substrate is placed in proper position, a surface of the notch can be irradiated without being blocked by the substrate 500. When the substrate 500 is placed on the securing/retaining member 15, the laser sensor 1140 measures distance. If the distance measured is a distance A to the notch 17, it is determined that that the substrate 500 is not out of position. On the other hand, if the distance measured is a distance W1 (<A), the substrate 500 is determined to be out of position. This technique requires modifying the design of many substrate holders to be used, providing the substrate holders with the notch 17 for position detection. If the substrate holder itself is thin, there may be difficulty in forming such a notch to ensure sufficient accuracy in detection.

Further, in general, various semiconductor manufacturing devices may in future be required to process with relatively high accuracy a variety of substrates that have not existed so far, for example, more intricately patterned substrates and substrates of more varying semiconductor material than conventional ones. These substrate manufacturing devices are expected to be more accurate than the existing ones, for example in transferring substrates onto the processing table and positioning them.

SUMMARY OF THE INVENTION

Problem to be Solved by the Invention

An object of the present invention is to solve the above-described problem at least to some extent.

Means for Solving the Problem

An aspect of the present invention provides a substrate processing device for processing substrates. The substrate processing device comprises: at least one image sensor for detecting the positions of two corners on at least one diagonal line of substrate when it is moved to a predetermined position; at least one illuminating device that can be positioned on an opposite side of the substrate at the predetermined position relative to the at least one image sensor, so as to illuminate the two corners of the substrate; and a control device designed to determine the position of the substrate, based on the positions of the two corners detected by the at least one image sensor. The control device may comprise a single controller or a plurality of controllers that operate in cooperation.

An aspect of the present invention provides a method for controlling a substrate processing device for processing substrates. This control method comprises: detecting the positions of two corners on at least one diagonal line of a substrate when the substrate is moved to a predetermined position, using at least one image sensor located on a second side of the substrate, while the substrate is being illuminated by at least one illuminating device on a first side of the substrate of the substrate; and determining the position of the substrate on the basis of the positions of the two corners detected by the at least one image sensor.

An aspect of the present invention provides a storage medium storing a program for executing the method of controlling the substrate processing device on a computer. This storage medium stores a program to be executed on the computer to detect the positions of two corners on at least one diagonal line of a substrate when the substrate is moved to a predetermined position, using at least one image sensor located on a second side of the substrate, while the substrate is being illuminated by at least one illuminating device on a first side of the substrate, and to determine the position of the substrate on the basis of the positions of the two corners detected by the at least one image sensor.

EMBODIMENTS

Below, the embodiments of the present invention are described with reference to the accompanying drawings.

Identical or corresponding members described in the embodiments below are denoted by the same numeral, and repetitive description of such identical or corresponding members is omitted. For convenience of description, the terms "top," "bottom," "left," "right," etc., used in this specification refer to positions or directions as viewed in the illustrative drawings and may differ from actual arrangement at the time of device use or the like. The description of a member as "located on the opposite of the substrate" to another member refers to one member positioned to face any surface of the substrate and another member positioned to face the opposite substrate surface. The substrate may be provided with wiring on one side or both sides thereof.

First. Embodiment

Figure 1:
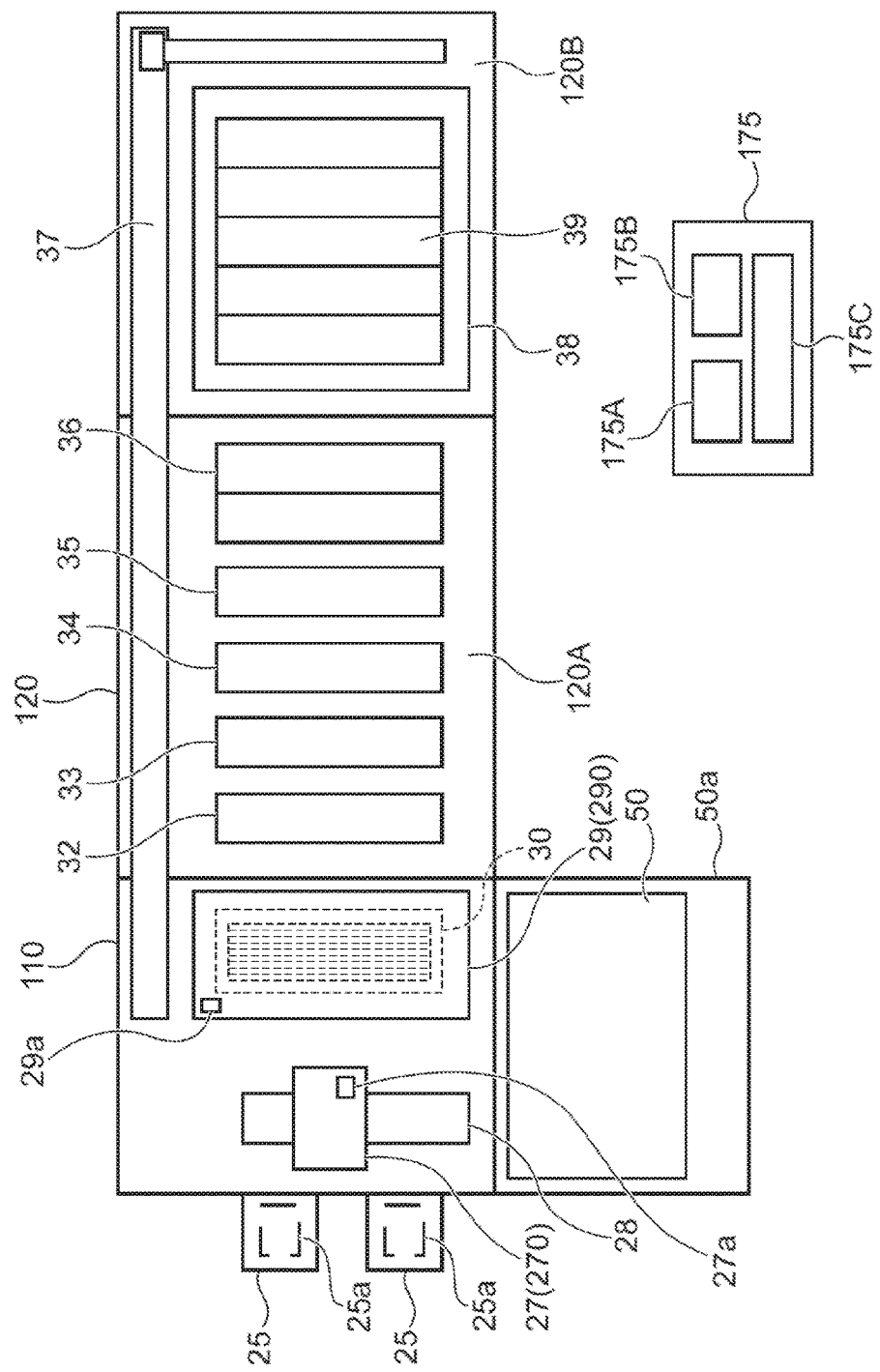
FIG. 1 shows the overall arrangement of a substrate processing device according to a first embodiment of the invention.

FIG. 1 shows the overall arrangement of a substrate processing device 100 according to the first embodiment of the present invention. In this example, the substrate processing device 100 is an electrolytic plating device. Here, this electrolytic plating device is described by way of example, but the present invention can be applied to any other plating devices, polishing devices, grinding devices, coating devices, etching devices, and other substrate processing devices.

The substrate processing device 100 mainly comprises: a loading/unloading section 110 for loading and unloading a substrate (workpiece) on and from the substrate holder 11; and a processing section 120 for processing the substrate S; and a cleaning section 50a. The processing section 120 comprises a pre-processing/post-processing subsection 120A for preprocessing and post-processing substrates and a plating subsection 120B for plating the substrates. The substrates include polygonal substrates and circular substrates. The polygonal substrates include rectangular and other polygonal glass substrates, liquid crystal substrates, printed substrates, and other polygonal workpieces. Circular substrates include semiconductor wafers, glass substrates, and other circular workpieces.

The loading/unloading section 110 comprises two cassette tables 25 and a substrate mounting/dismounting mechanism 29. The cassette tables 25 are to be equipped with a cassette 25a containing substrates S. The substrate mounting/dismounting mechanism 29 is placed in a substrate mounting/dismounting section 290 and is configured to mount and dismount the substrates S on and from the substrate holder 11. The substrate mounting/dismounting mechanism 29 comprises a control device 29a. This control device 29a communicates with a controller 175 of the substrate processing device 100 and controls the movements of the substrate mounting/dismounting mechanism 29. Near (e.g., below) the substrate mounting/dismounting mechanism 29 is provided a stocker 30 for accommodating the substrate holder 11. At the center of these units 25, 29, and 30 is disposed a substrate transfer device 270 comprising a transfer robot 27 for transferring substrates between the units. The substrate transfer device 270 is configured to be driven by a drive mechanism 28. The substrate transfer device 270 comprises a controller 27a. This controller 27a communicates with a controller 175 of the substrate processing device 100 and controls the movements of the substrate transfer device 270.

The cleaning section 50a has a cleaning device 50 for cleaning and drying substrates after being plated. The substrate transfer device 270 is configured to transfer the substrates after being plated to the cleaning device 50 and to take the cleaned substrates out of the cleaning device 50.

The pre-processing/post-processing subsection 120A comprises a pre-wet tank 32, a pre-soak tank 33, a pre-rinse tank 34, a blow tank 35, and a rinse tank 36. In the pre-wet tank 32, substrates are submerged in deionized water. In the pre-soak tank 33, oxide film on a surface of an electrically conducting surface, such as a seed layer or the like formed on a surface of the substrate, is etched away. In the pre-rinse tank 34, the substrates after being pre-soaked, together with the substrate holder, are cleaned in a cleaning liquid (deionized water or the like). In the blow tank 36, the substrates after being cleaned are dried. In the rinse tank 36, the substrates after being plated, together with the substrate holder, are cleaned in cleaning liquid. This structure of the pre-processing/post-processing subsection 120A of the substrate processing device 100 is only one example and is not limited to this example, and any other designs can be employed.

The plating subsection 120B has a plurality of plating tanks 39 comprising an overflow tank 38. Each plating tank 39 contains one substrate therein to soak the substrate in a plating solution held in the tank 39, thereby applying copper plating or the like to the surface of the substrate. The type of plating solution is not particularly limited, a variety of plating solutions are used according to use.

The substrate processing device 110 is located on one side of these devices and provided with a substrate holder transfer device 37 of, for example, linear motor type to transfer the substrate holder with substrates between these devices. This substrate holder transfer device 37 is configured to transfer the substrate holder between the substrate mounting/dismounting mechanism 29, the pre-wet tank 32, the pre-soak tank 33, the pre-rinse tank 34, the blow tank 35, the rinse tank 36, and the plating tank 39.

The plating system comprising the substrate processing device 100 so structured comprises the controller 175 configured to control the above-described sections. The controller 175 comprises: memory 175 storing a variety of setting data and a variety of programs; a CPU 175A for executing the programs stored in the memory 175B; and a control section 175C implemented by execution of a program by the CPU 175A. Storage medium of the memory 175 may include one or a plurality of desired storage media, such as ROMs, RAMs, hard disks, CD-ROMs, DVD-ROMs, and flexible discs. Programs stored in the memory 175A include, for example, a program for performing transfer control of the substrate transfer device 270, a program for controlling a substrate position detector 60 (described later), a program for controlling the substrate mounting/dismounting mechanism 29 to mount and dismount substrates on and from the substrate holder, a program for performing transfer control of the substrate holder transfer device 37, and a program for performing plating control of the plating tanks 39. The controller 175 is configured to communicate with an unillustrated master controller for comprehensively controlling the substrate processing device 100 and other relevant devices, and to exchange data between a database of the master controller.

Figure 2:
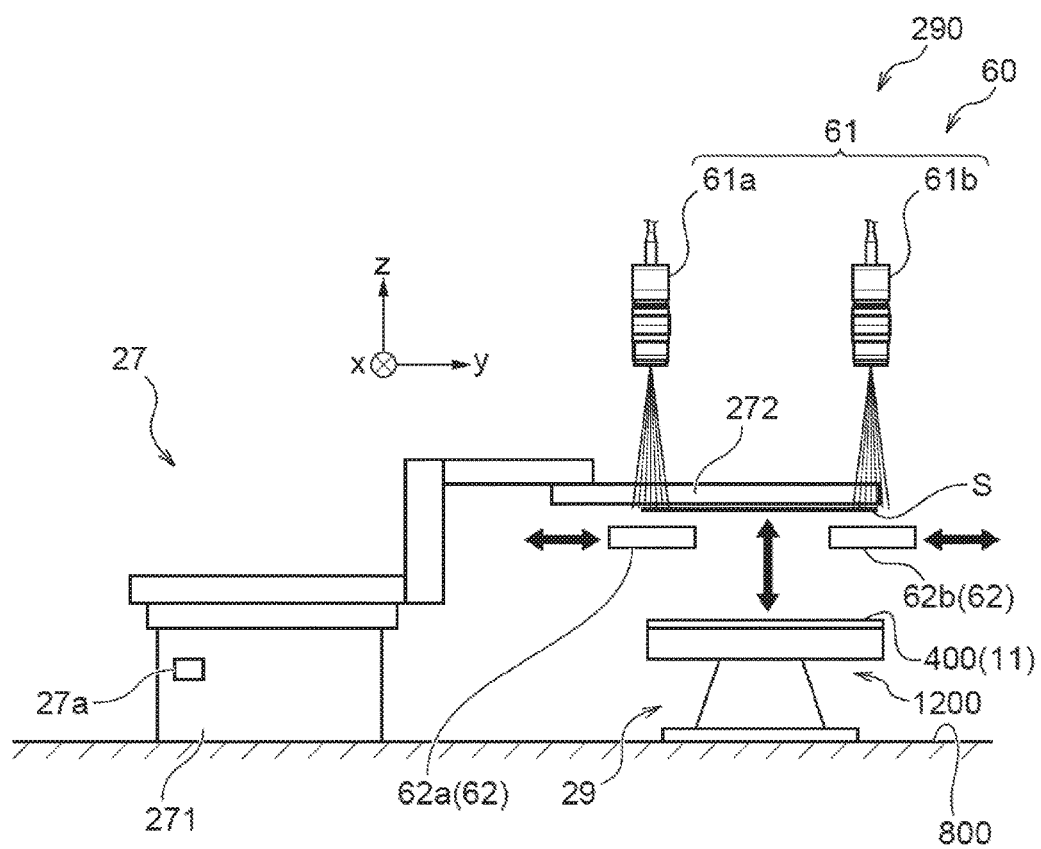
FIG. 2 is a schematic view of a substrate position detector according to the first embodiment.

FIG. 2 is a schematic view of the substrate position detector 60 according to the first embodiment. The substrate position detector 60 has an image sensor 61 (61a, 61b) and an illuminating device 62 (62a, 62b). In this embodiment, the image sensor 61 and the illuminating device 62 of the substrate position detector 60 that are provided in the substrate mounting/dismounting section 290 will be described by way of example. As shown in FIG. 2, the substrate mounting/dismounting section 290 comprises the substrate mounting/dismounting device 29 having a rotating device (swing device) 1200. The rotating device 1200 has a support plate 1210 with a second holding member 400 of the substrate holder 11 thereon. With this arrangement, the substrate S is mounted on the second holding member 400. The substrate S is taken out of the cassette 25a by the transfer robot 27 and transferred onto the second holding member 400. The substrate holder 1 further comprises an unillustrated first holding member to hold the substrate S between the first holding member and the second holding member 400.

Figure 3A:
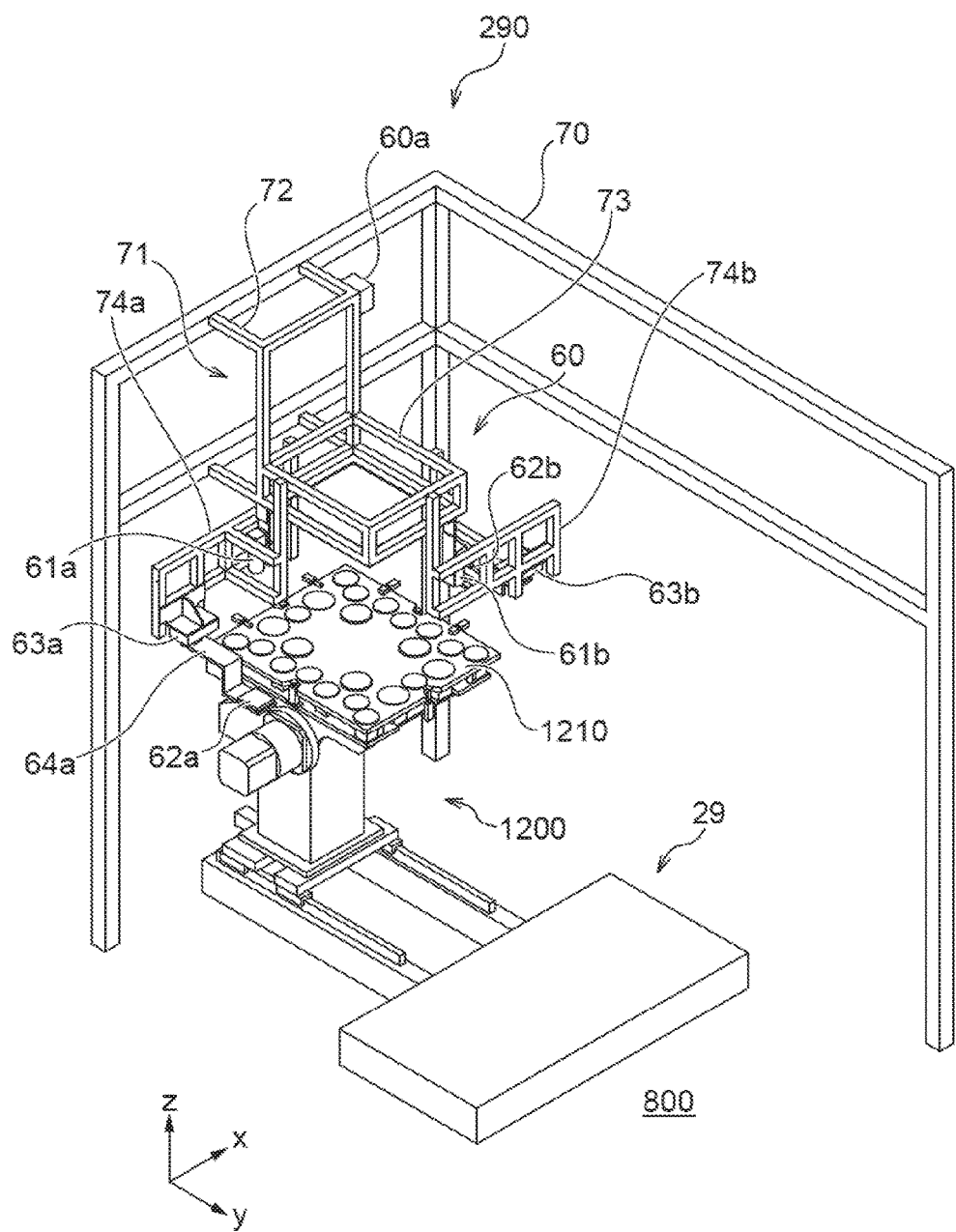
FIG. 3A is a perspective view of the substrate position detector of the first embodiment at a non-imaging position.

The transfer robot 27 comprises a robot body 271, a robot hand 272 attached to the robot body 271, and a controller 27a. The controller 27a controls the movements of the robot hand 272. The robot hand 272 is capable of holding the substrate S with or without contact. The robot hand 272 uses, for example, a Bernoulli chuck to hold the substrate S without contact. The transfer robot 27 is a multi-axial robot capable of moving the substrate S on the robot hand 272 in the x-, y-, and z-direction and also a rotational direction. The x-, y-, and z-axes are defined as shown in FIG. 3A. For example, the x-axis may be perpendicular to the reciprocating direction of the rotating device 1200, the y-axis in the reciprocating direction of the rotating device 1200, and the z-axis perpendicular to the x- and y-axes. In this case, the x- and y-axes are parallel to a mounting plane 800 and the z-axis perpendicular to the mounting plane 800. There may be provided two or more robot hands.

The image sensors 61a and 61b are disposed adjacent to the substrate mounting/dismounting device 29. The image sensors 61a and 61b are, for example, cameras. The image sensors 61a and 61b are located at such a position that when the substrate S is transferred by the robot hand 272 to directly above a target mounting position for the substrate S on the second holding member 400 of the substrate holder 11, the image sensors 61a and 61b can detect corners of the substrate S.

Figure 12:
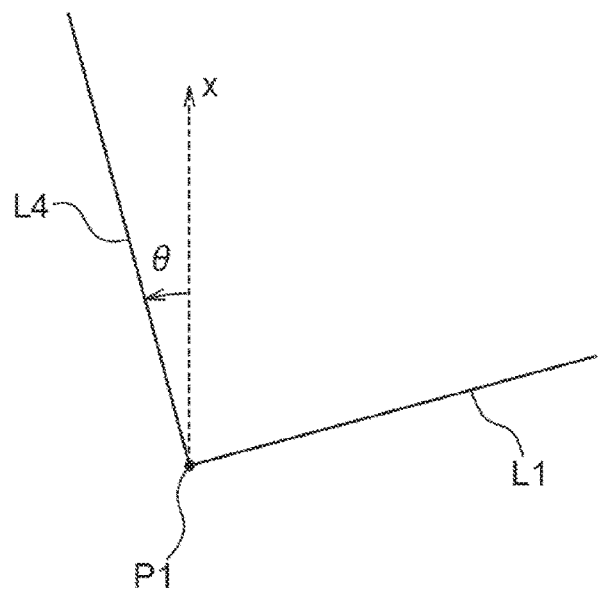
FIG. 12 describes a rotational angle of the substrate.

The "target mounting position" refers to a proper position at which the substrate S is to be positioned when it is brought onto the second holding member 400. In this embodiment, the "target mounting position" is defined as a target central position $(x_t, y_t)$ for the center of the substrate S and a target rotational angle $\theta_0$ for the substrate S. The rotational angle of the substrate S is defined as the rotational angle $\theta$ by which a side of the substrate S that has been along the x-axis (or the y-axis) on the x-y plane is inclined relative to the x-axis (or the y-axis). FIG. 12 indicates as the rotational angle $\theta$ the angle of a side L4 that has been along the x-axis inclined relative to the x-axis. The target rotational angle $\theta_0$ is the angle of the target direction in which the substrate S is to be oriented relative to the x-axis (or the y-axis) on the second holding member 400. In this embodiment, the target direction coincides with the x-axis (or the y-axis), i.e., the target rotational angle $\theta_0=0$. In this case, the rotational angle $\theta$ of the substrate S is equal to 0 degrees when the side of the substrate S that lies along the x-axis (or the y-axis) remains parallel to the x-axis (or the y-axis) and is not tilted; in other words, the target rotational angle $\theta_0=0$. The target direction in which the substrate S is to be oriented on the second holding member 400 may not necessarily be parallel to the x- or y-axis.

The phrase "directly above a target mounting position" refers to such a position that the substrate S, when moved down exactly in the z-direction, will be disposed at the target mounting position (the target central position and the target rotational angle) on the second holding member 400. In other words, when "directly above a target mounting position," the position of the substrate S (the central position and the rotational angle) on the x-y plane coincides, except for the z-coordinate, with the target mounting position (the target central position and the target rotational dangle) on the second holding member 400.

The illuminating devices 62a and 62b are provided on the opposite side of the substrate S to the image sensors 61a and 61b. The illuminating devices 62a and 62b are so positioned as to illuminate corners of the substrate S from the side opposite to the image sensors 61a and 61b. The illuminating devices 62a and 62b are backlights comprising LEDs. The illuminating devices 62a and 62b are configured to move between an imaging position where they are opposed to the image sensors 61a and 62a and a retracted position where they are moved outward from the imaging position. This prevents the robot hand 272 from obstructing the transfer path of the substrate S to the second holding member 400. When images of the corners of the substrate S are being taken by the image sensors 61a and 61b, the background of the substrate S, illuminated by the illuminating devices 62a and 62b on the opposite side, appears white, making the profile of the substrate S definite. Since the illuminating devices 62a and 62b are located between the substrate S and the second holding member 400, the profile of the substrate S can be made definite even if the outer periphery and its vicinity of the substrate S are similar in color to the second holding member 400.

When the substrate S is moved by the robot hand 272 to directly above the target mounting position of the second holding member 400 of the substrate holder 11, the illuminating devices 62a and 62b will be moved to the image position to illuminate two of the four corners of the substrate S. At this stage, the image sensors 61a and 61b take images of two corners on a diagonal line of the substrate S. These images are used to detect the position of each corner (the x- and y-coordinates), and the direction (on the x-y plane) of at least one side of the two adjacent sides at a corner or each corner. From the positions of the two corners, the coordinates ($x_0$, $y_0$) of the center of the substrate S are calculated, and from the direction of at least one side of the two adjacent sides, the rotational angle θ of the substrate S is calculated. It is then determined whether the difference between the coordinates ($x_0$, $y_0$) of the center and the rotational angle θ so calculated and the target mounting position (target central position ($x_t$, $y_t$) and rotational angle $θ_0$=0) is within a predetermined range. If the difference between the coordinates ($x_0$, $y_0$) of the center and the rotational angle θ calculated on the one hand and the target mounting position and rotational angle on the other is within the predetermined range, then the illuminating devices 62a and 62b will be moved to the retracted position and the substrate S will be moved down onto the second holding member 400. If, on the other hand, the difference between the coordinates ($x_0$, yd of the center and the rotational angle θ calculated and the target mounting position and rotational angle is outside the predetermined range, the robot hand 272 will be moved in the x- and y-directions and/or in a rotational direction on the x-y plane to correct the position of the substrate S, thus bringing the coordinates ($x_0$, $y_0$) of the center and the rotational angle θ of the substrate S close to the target central position and rotational position. Subsequently, by taking images of the position of the substrate S, the coordinates ($x_0$, $y_0$) of the center and the rotational angle θ of the substrate S are determined again and after the difference between the coordinates of the center and the rotational angle of the substrate S and the target central position and rotational position have been brought within the predetermined range, the substrate S will be moved down onto the second holding member 400.

(The Structure of the Substrate Position Detector)

Figure 3B:
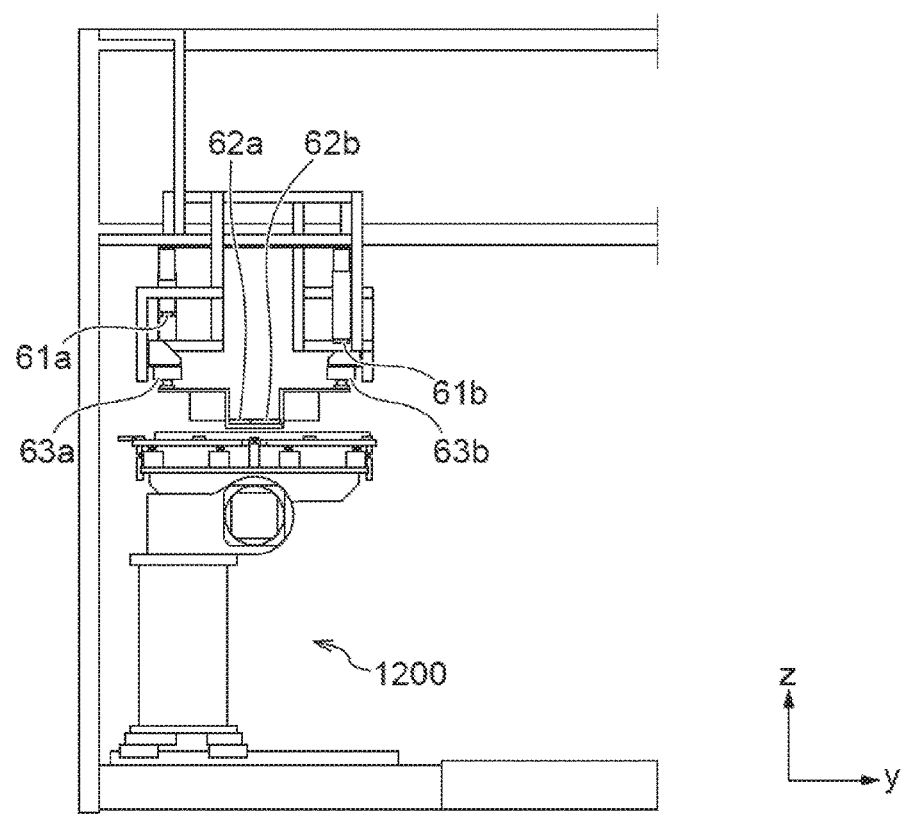
FIG. 3B is a side view of the substrate position detector of the first embodiment at the non-imaging position.
Figure 3C:
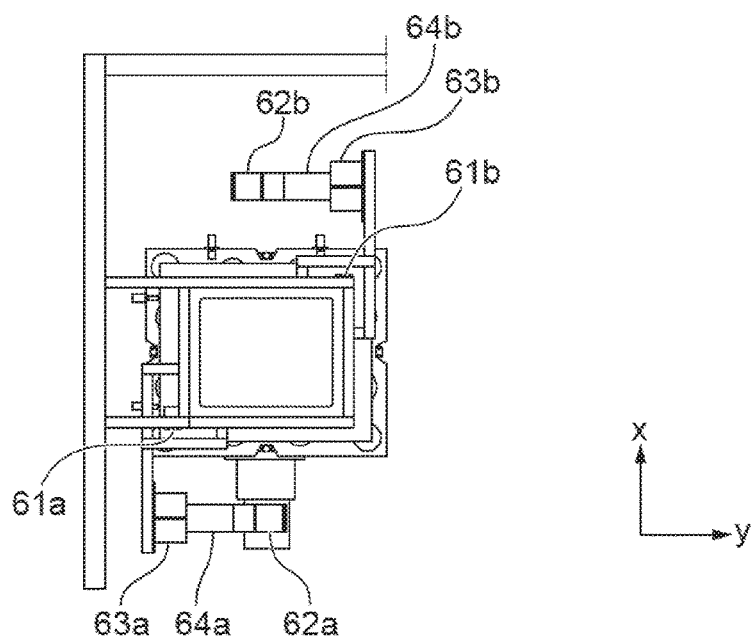
FIG. 3C is a plan view of the substrate position detector of the first embodiment at the non-imaging position.
Figure 4A:
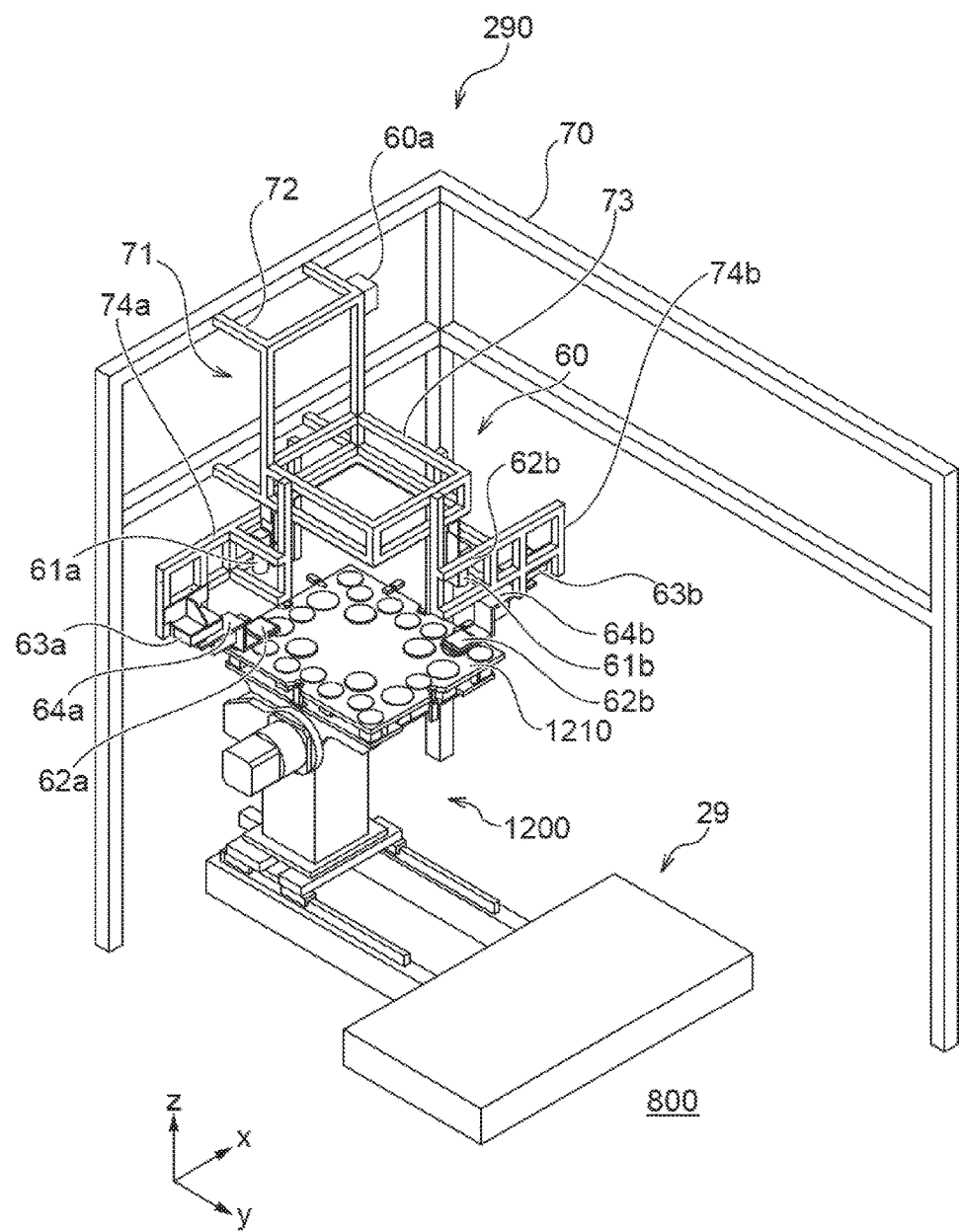
FIG. 4A is a perspective view of the substrate position detector of the first embodiment at an imaging position.
Figure 4B:
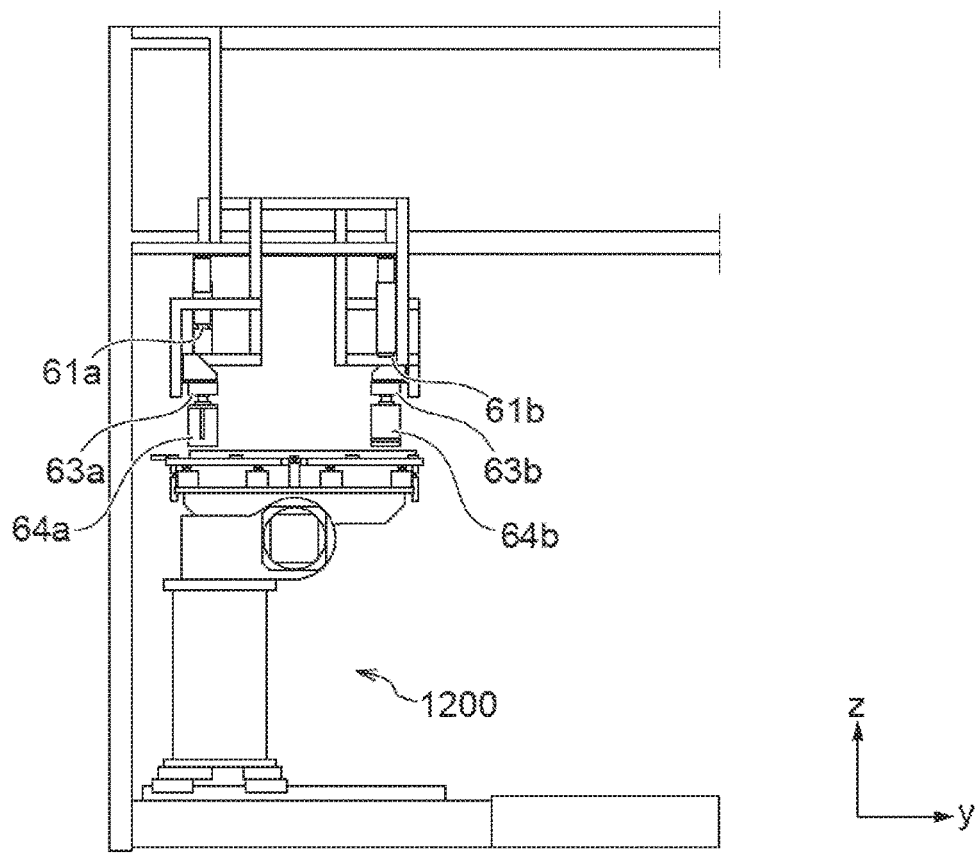
FIG. 4B is a side view of the substrate position detector of the first embodiment at the imaging position.
Figure 4C:
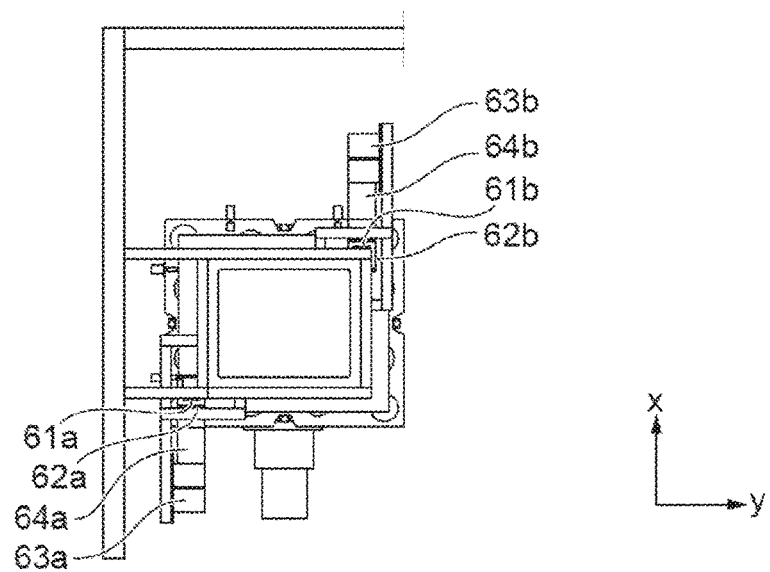
FIG. 4C is a plan view of the substrate position detector of the first embodiment at the imaging position.

FIGS. 3A, 3B, and 3C are a perspective, a side, and a plan view of the substrate position detector 60 of the first embodiment at the non-imaging position, respectively. FIGS. 4A, 4B, and 4C are a perspective, a side, and a plan view of the substrate position detector 60 of the first embodiment at the imaging position, respectively.

The substrate position detector 60 comprises image sensors 61a and 61b and illuminating devices 62a and 62b. The image sensors 61a and 61b and the illuminating devices 62a and 62b are located adjacent to the substrate mounting/ dismounting device 29 in the substrate mounting/dismounting section 290. Also provided is a controller 60a for controlling the movements of the image sensors and the illuminating devices. The controller 60a is communicatively connected to the image sensors 61a and 61b and the illuminating devices 62a and 62b. Around the substrate mounting/dismounting device 29 is provided a frame 70 comprising a plurality of posts and beams. The frame 70 is located on the mounting plane 800 of the substrate mounting/ dismounting device 29 and adjacent to the substrate mounting/dismounting device 29. To the frame 70 is fixed a mounting structure 71 for mounting the image sensors 61a and 61b and the illuminating devices 62a and 62b.

The mounting structure comprises mounting members 72, 73, and 74a and 74b. The mount member 72 is secured to the frame 70. The mounting member 73 is fixed to the mounting member 72 and is located above a support plate 1210 of a rotating device 1200 of the substrate mounting/dismounting device 29 so that mounting member 73 extends substantially parallel to the support plate 1210. The mounting member 73 is substantially rectangular in plan view and encloses an area smaller than the support plate 1210. At two corners on a diagonal line of the mounting member 73 are attached the image sensors 61a and 61b. The imaging direction of the image sensors 61a and 61b is toward the support plate 1210.

The mounting members 74a and 74b are attached near the two corners where the image sensors 61a and 61b are attached to the mounting member 73. The mounting member 74a and 74b are located on a side closer than the mounting member 75 to the support plate 1210 and extend away from each other outward of the mounting member 73. At tips of the mounting members 74a and 74b are attached rotating devices 63a and 63b having arms 64a and 64b, tips of which have the illuminating devices 62a and 62b attached thereto. The illuminating direction of the illuminating devices 62a and 62b is away from the support plate 1210.

The image sensors 61a and 61b are, for example, cameras. The cameras are black-and-white or color ones. From a standpoint of accuracy in position detection, black-and-white ones are preferable. This embodiment thus uses black-and-white cameras as the image sensors 61a and 61b. Color cameras, if they are sufficient in accuracy in position detection, may be used instead. Alternatively, for example, a black-and-while/color switchable camera may be used to take color images by inserting a infrared cut filter into the camera in front of its imaging device in the case where the illuminance in the device is greater than or equal to a predetermined value (if it is bright), and to take black-and-white images by taking the infrared cut filter out in the case where the illuminance in the device is lower than the predetermined value (dark). The image sensors 61a and 61b are attached at two corners on a diagonal line of the mounting member 73 of substantially rectangular in plan view. The image sensors 61a and 61b are so attached that its imaging direction points toward the support plate 1210. When the substrate S is moved to above the second holding member 400 on the support plate 1210, the image sensors 61a and 61b are disposed at such positions as to take images of two corners on a diagonal line of the substrate S.

Figure 11:
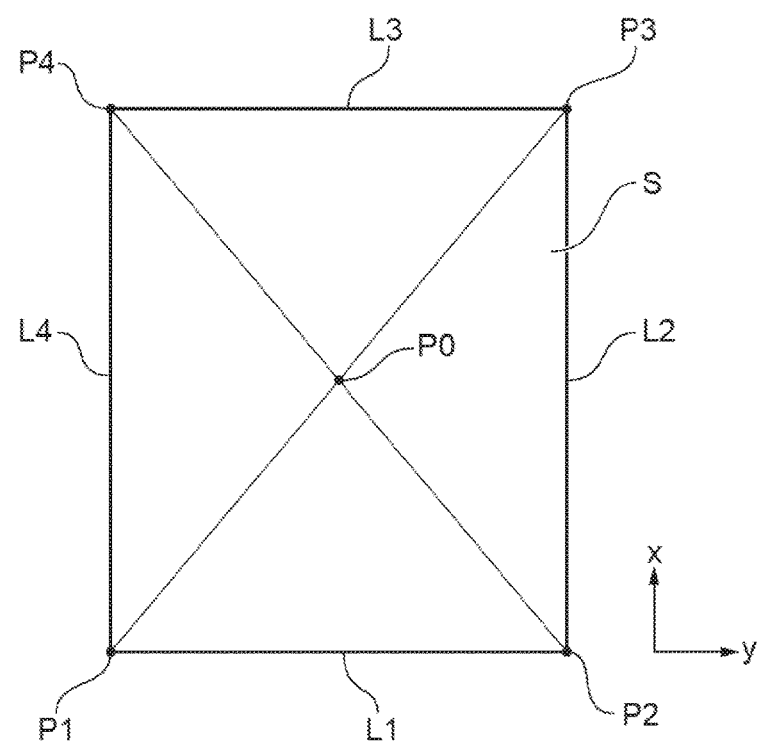
FIG. 11 is a plan view of the substrate.
Figure 13:
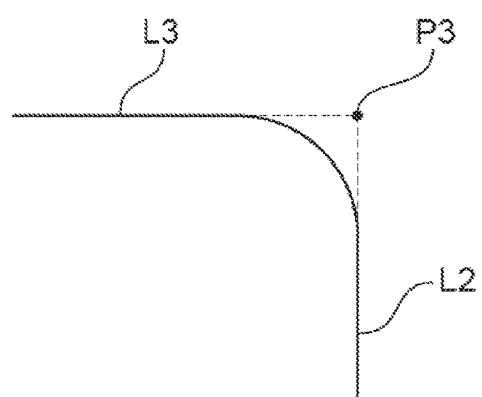
FIG. 13 describes the position of a corner of the substrate.

FIG. 11 is a plan view of the substrate S. FIG. 12 describes the rotational angle of the substrate S. FIG. 13 describes the position of a corner of the substrate. In this embodiment, the substrate S is a substantially rectangular substrate with four sides L1, L2, L3, and L4 and four corners P1, P2, P3, and P4. The center P0 of the substrate S may be defined as the intersection of the two diagonal lines. In this embodiment, since the two corners (e.g., corners P1 and P3) on a diagonal line are measured, the midpoint of the diagonal line connecting the corners P1 and P3 is calculated as the position ($x_0$, $y_0$) of the center P0.

The positions of the corners P1 to P4 are each defined as the intersection of two adjacent sides at each corner (adjacent sides). The positions of the corners P1 to P4 refer to the positions the apexes of the substrate S; however, in the case that the corners are rounded or the positions of the apexes are obscure, the positions of the corners can be calculated accurately by defining the position of the corner as the intersection of the two adjacent sides. For example, as shown in FIG. 13, if the substrate S is rounded at the corner P3, image data on the two straight segments of two sides L2 and L3 adjacent to the corner is obtained and the position where lines extending from the straight segments of the sides cross is calculated as the position of the corner P3.

Figure 14A:
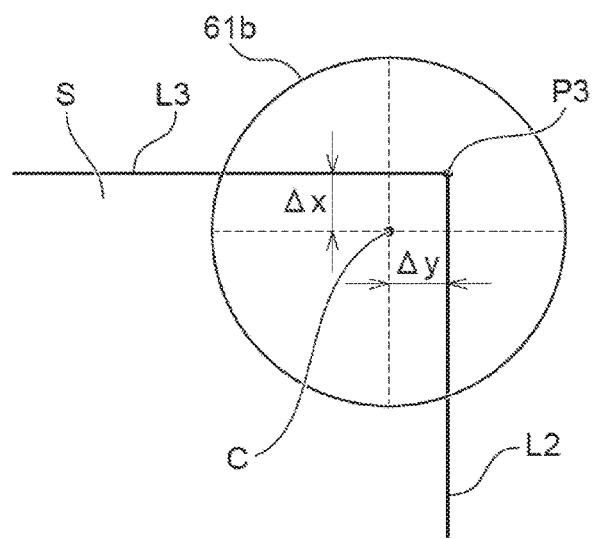
FIG. 14A describes an imaging position of the image sensor.
Figure 14B:
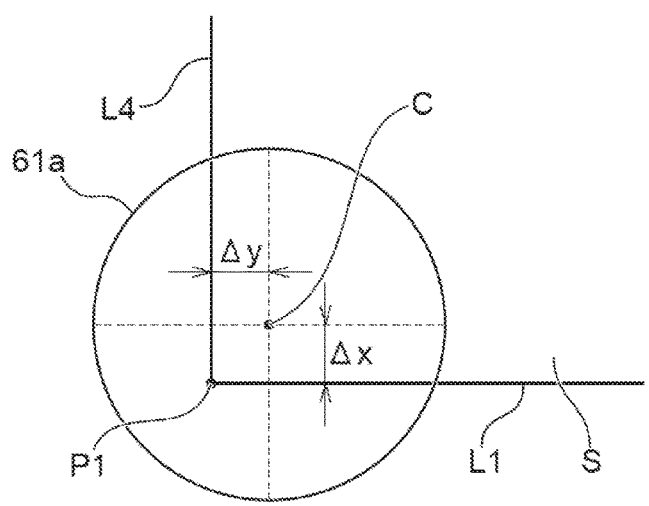
FIG. 14B also describes the imaging position of the image sensor.

FIGS. 14A and 14B describe the imaging position of an image sensor. The image sensors 61a and 61b are disposed at such positions as to take images of the two corners P1 and P3 of the substrate S when it is moved to a predetermined position above the support plate 1210 (directly above the target mounting position on the second holding member 400). For example, the image sensors 61a and 61b are attached to the mounting member 73 in such a manner that the positions of the image sensors 61a and 61b are pre-adjusted with the substrate S placed at the target mounting position on the second holding member 400 on the support member 1210. In this embodiment, the image sensors 61a and 61b, as shown in FIGS. 14A and 14B, are attached so that the center C of an imaging portion (e.g., a lens) is located in plan view at a position displaced inwardly by predetermined distances Δx, Δy in the x- and y-directions from the corners P1 and P3 of the substrate S. In other words, the center C of the image sensors 61a and 61b corresponds to a position inward of the corner (apex) of the substrate S. With this arrangement, an image of a wider range near the corners P1 and P3 of the substrate S can be taken by the image sensors 61a and 61b, with the result of improved accuracy in detection of the positions of the corners. For example, an image of a wider range than two adjacent sides (L1-L4, L2-L3) can be taken, resulting in improved accuracy in calculating the positions of the corners P1 and P3 as the intersection of two adjacent sides and in calculating the rotational angle θ of the substrate S from an incline of at least one of the adjacent sides. The distance of displacement of the center C of the imaging portion inward of the substrate S may vary from image sensor to image sensor, or the center of the imaging portion may be displaced inward for only some image sensors. In another embodiment, the center of the imaging portions of some or all image sensors may coincide in plan view with the position of a corner (apex) of the substrate or may be located outward of the corner (apex) of the substrate.

The illuminating devices 62a and 62b may be, for example, rectangular backlights (FIGS. 3A, 3C). The backlights may be, for example, of CA-D series produced by Keyence Corporation. The backlights may be, for example, ones having an illumination range of 77 mm by 77 mm. The illuminating devices 62a and 62b are attached to the arms 64a and 64b of the rotating devices 63a and 63b and are capable of moving between imagining positions (FIGS. 4A to C) opposed to the image sensors 61a and 62a and retracted positions (FIG. 3A to C) moved outward from the respective imaging positions. In this way, the illuminating devices 62a and 62b, once moved to the retracting positions, do not obstruct the transfer path of the substrate S, after being imaged, to the second holding member 400. The rotating devices 63a and 63b may be, for example, rotary actuators comprising air cylinders. However, the rotating devices 63a and 63b may be any devices with drive sources and drive mechanisms so long as they are capable of moving the illuminating devices 62a and 62b between the imaging position and retracted position. From a viewpoint of economy of space, the rotating devices 63a and 63b are preferable; however, any desired linear motion devices that linearly move the illuminating devices 62a and 62b between the imaging and retracted positions may be used instead.

The controller 60a is mounted on the mounting member 72. The controller 60a comprises: memory storing predetermined programs; a CPU for executing the programs stored in the memory; and a control section that is implemented as the CPU executes a program. The programs in the memory include a program for controlling imaging of the image sensors 61a and 61b and a program for calculating the position of the center and the rotational angle of the substrate S on the basis of captured images. The programs in the memory also include a program for controlling the movements of the rotating devices 63a and 63b of the illuminating devices 62a and 62b and a program for controlling turning on and off of the illuminating devise 62a and 62b.

Figure 5:
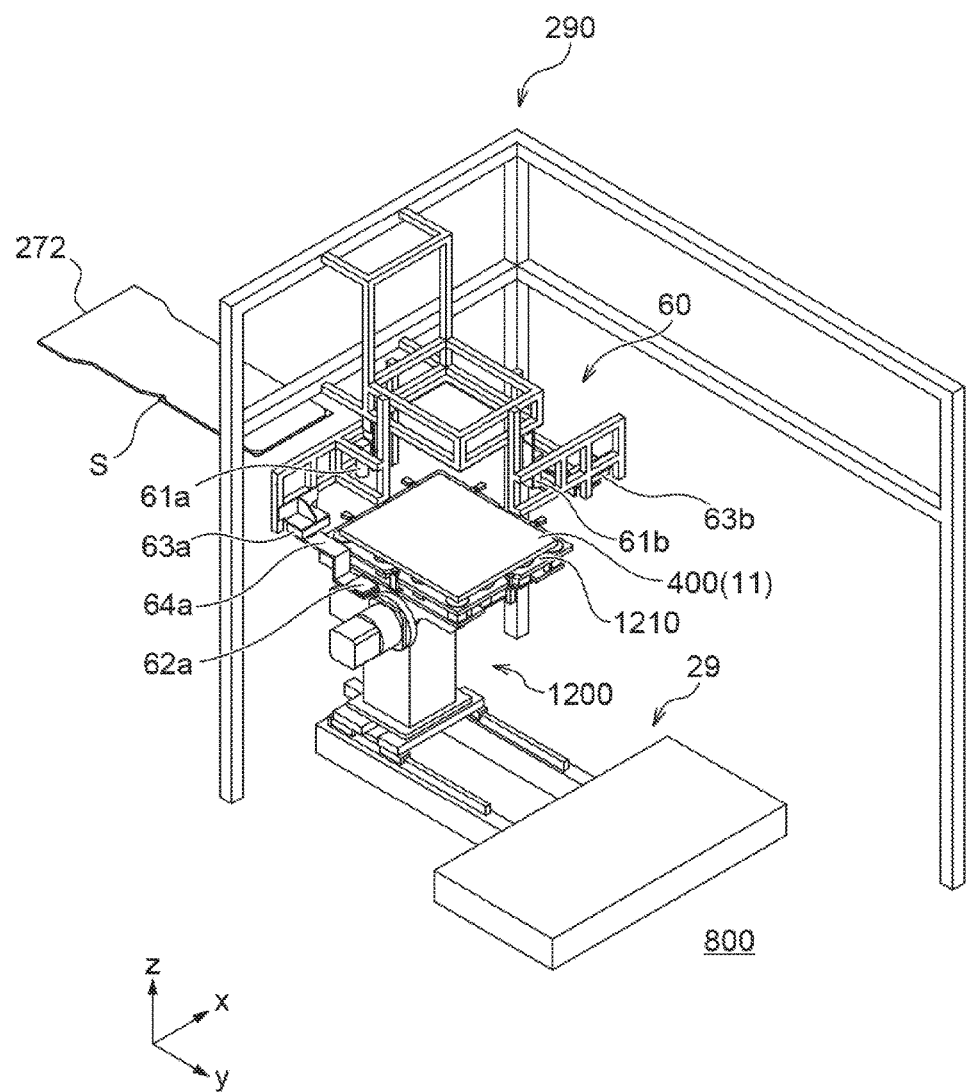
FIG. 5 is a perspective view of the substrate position detector with the substrate approaching the imaging position.
Figure 6:
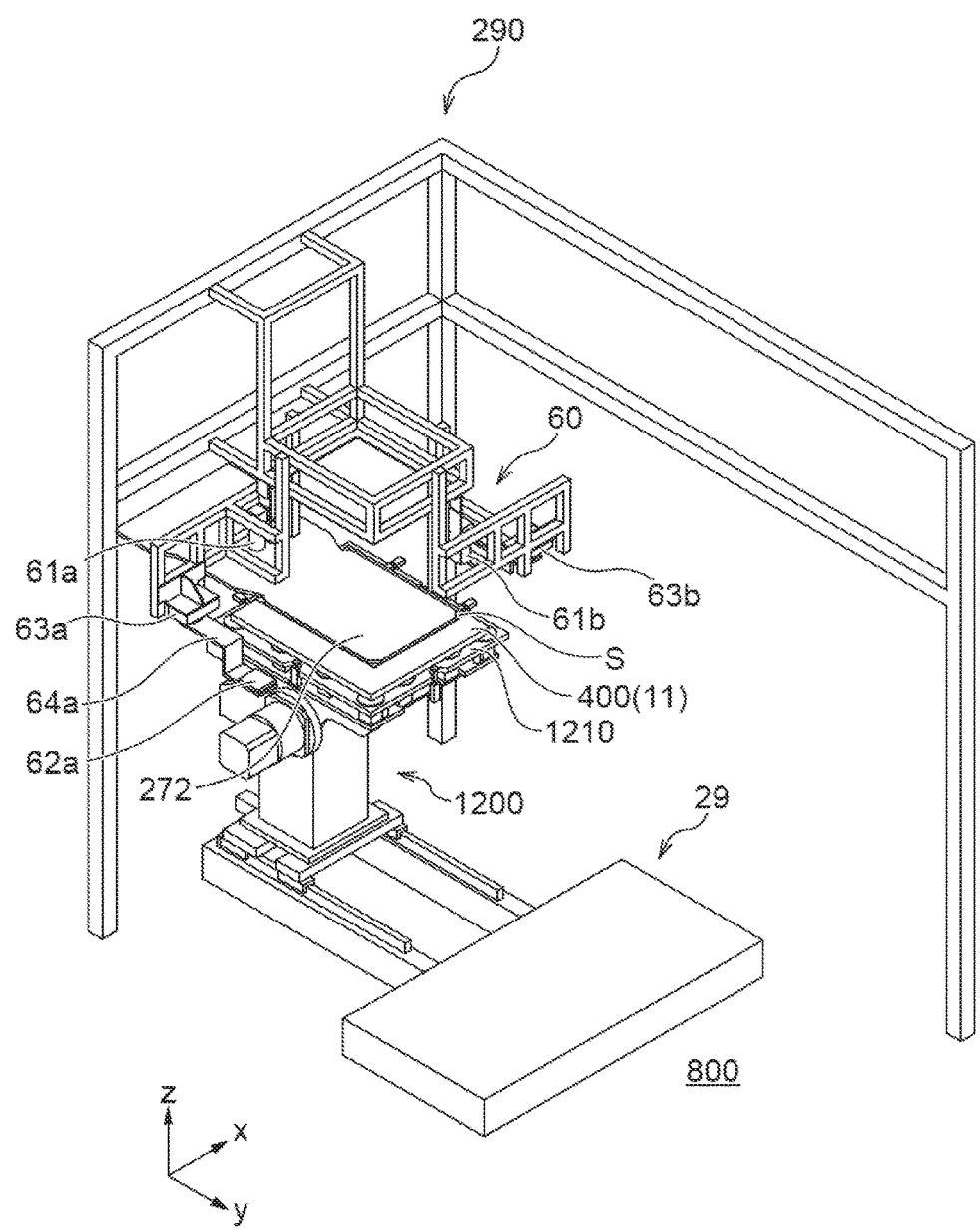
FIG. 6 is a perspective view of the substrate position detector with the substrate at the imaging position.
Figure 7A:
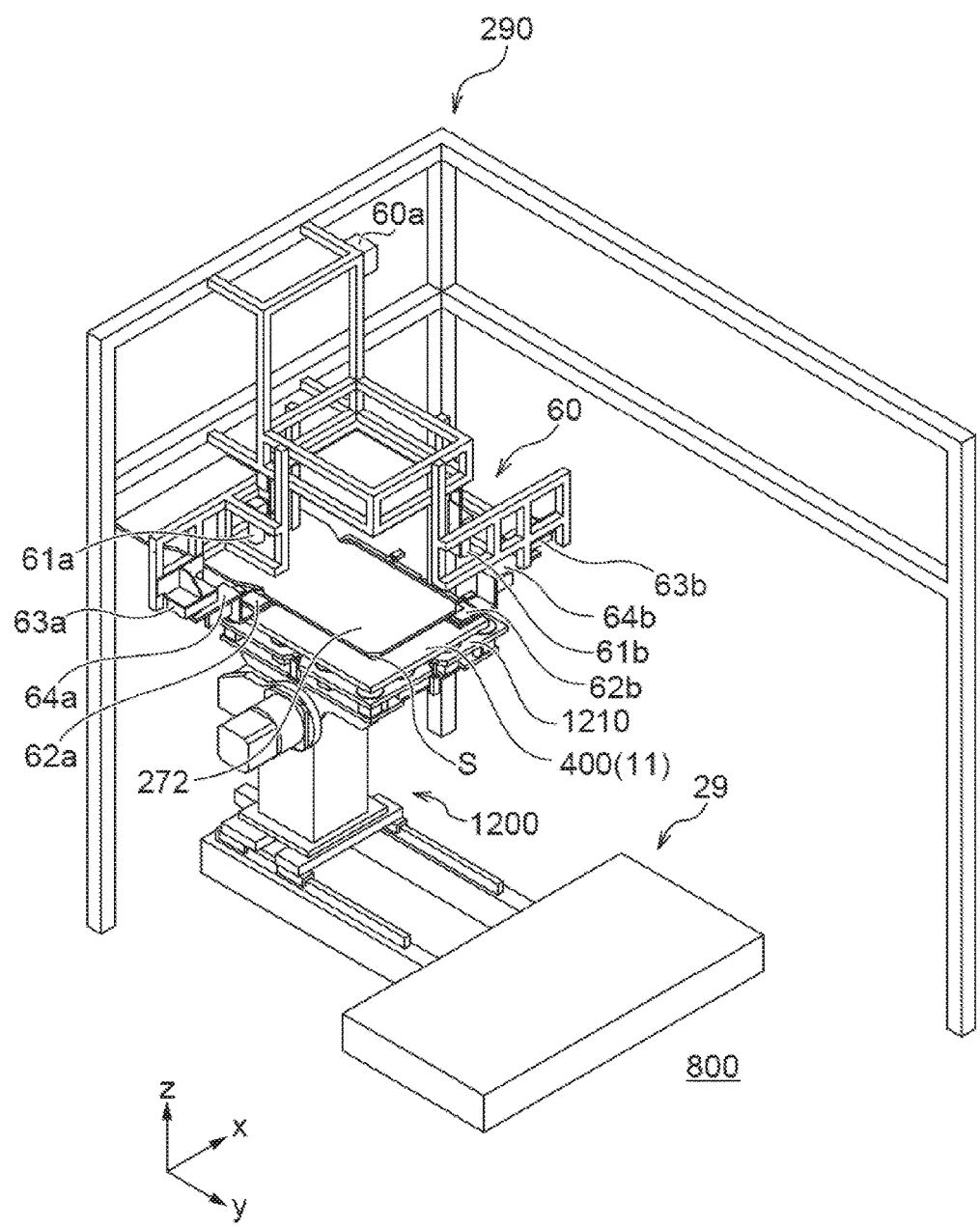
FIG. 7A is a perspective view of the substrate position detector when the illuminating device is moved to the imaging position.
Figure 7B:
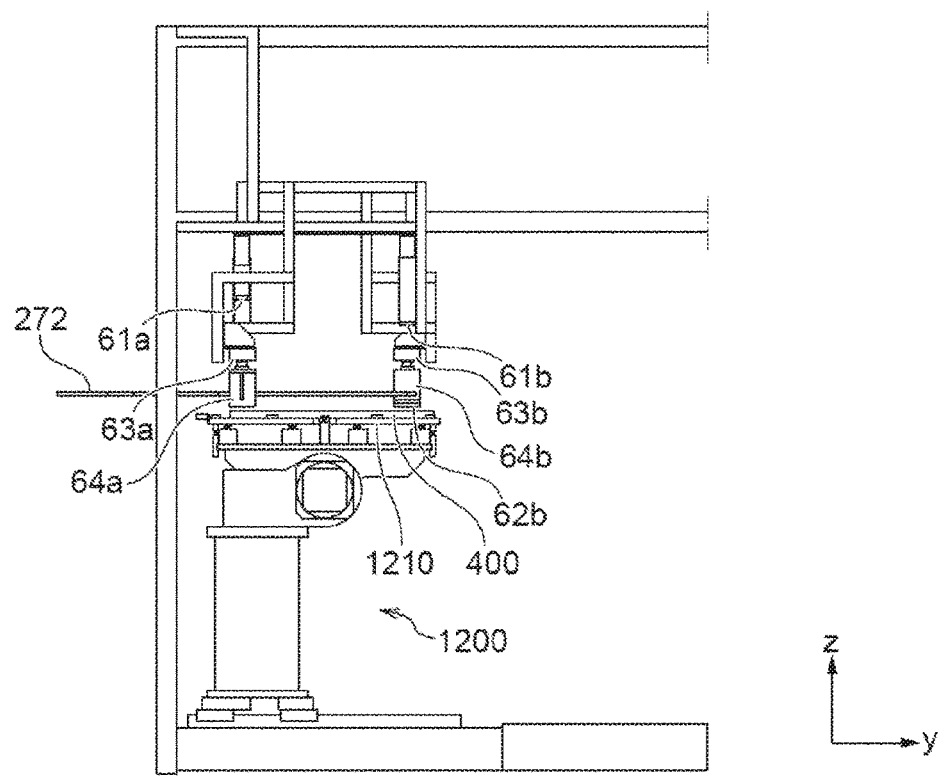
FIG. 7B is a side view of the substrate position detector when the illuminating device is moved to the imaging position.
Figure 7C:
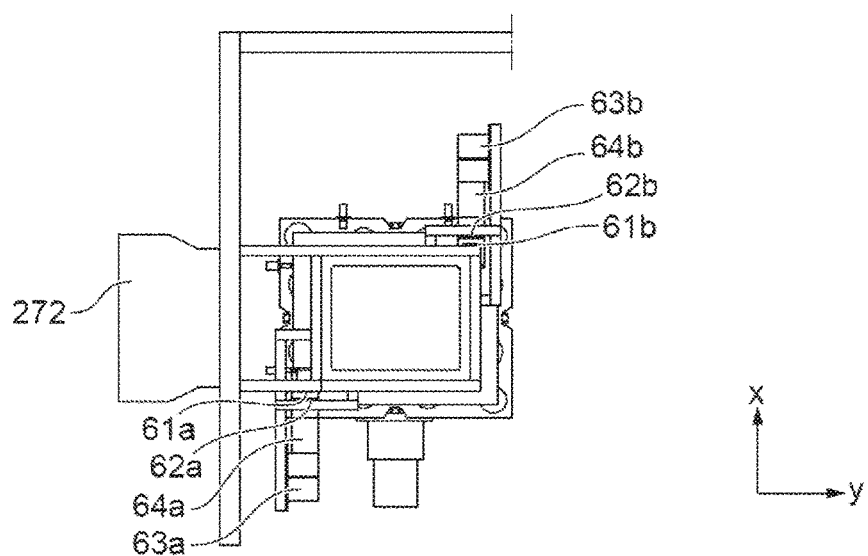
FIG. 7C is a plan view of the substrate position detector when the illuminating device is moved to the imaging position.
Figure 8:
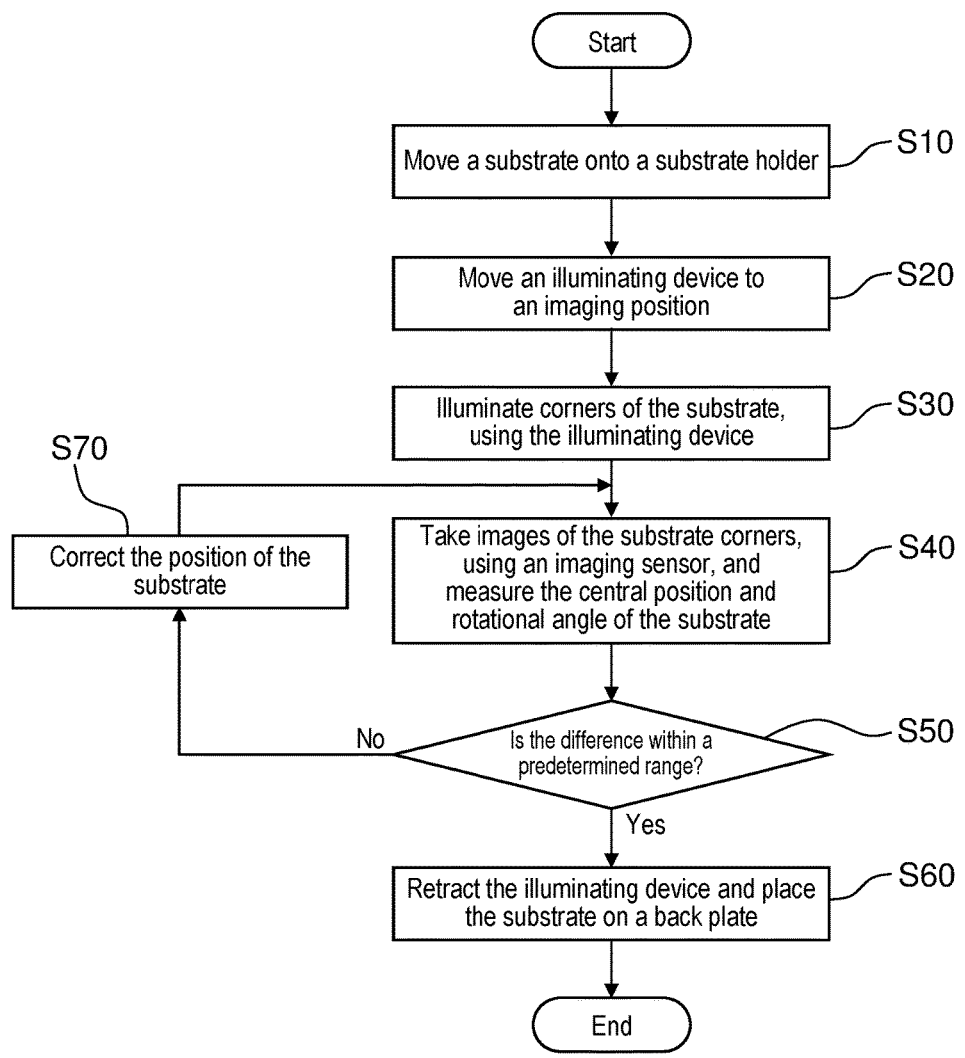
FIG. 8 is a flowchart of a process of adjusting the position of the substrate.

FIG. 5 is a perspective view of the substrate position detector 60 with the substrate S approaching the imaging position. FIG. 6 is another perspective view of the substrate position detector 60 with the substrate S at the imaging position. FIGS. 7A, 7B, and 7C are a perspective, a side, and a plan view of the substrate position detector 60 with the illuminating devices 62a and 62b moved to the imaging position. FIG. 8 is a flowchart of a substrate position adjustment process. Below, the substrate position adjustment process of this embodiment is described with reference to FIGS. 5 to 8. The substrate position adjustment process of this embodiment is carried out by the controller 175 for controlling the entire substrate processing device 100, the controller 60a for controlling the substrate position detector 60, and the controller 27a for the transfer robot 27, which operate in cooperation. The substrate position adjustment process of this embodiment may be carried out by only the controller 60a and the controller 27a after receiving a transfer command from the controller 175.

Prior to the start of the substrate position adjustment process, the second holding member 400 of the substrate holder 11 is fixedly positioned on the support plate 1210 of the rotating device 1200, as shown in FIG. 5.

In step S10 of FIG. 8, the substrate S is moved by the robot hand 272 of the transfer robot 27 to directly above the target mounting position on the second holding member 400 (FIGS. 5 and 6). In this embodiment, the substrate S is held on the bottom surface of the robot hand 272. The target mounting position on the second holding member 400 is preset as the position (target central position ($x_t$, and $y_t$) at which the center of the substrate S is to be positioned on the second holding member 400 and the direction (target rotational angle $θ_0=0$) in which the substrate S is to be oriented, and is stored in the controller 175, controller 60a, and/or controller 27a.

In step S20, the illuminating devices 62a and 62b are rotated by the rotating devices 63a and 63b from the retracted position to the imaging position. The imaging position is where the illuminating devices 62a and 62b are opposed to the image sensors 61a and 61b below the two corners P1 and P3 (FIG. 11) on a diagonal line of the substrate S (FIGS. 7A to 7C).

In step S30, the illuminating devices 62a and 62b are turned on to illuminate the two corners P1 and P3 on the diagonal line of the substrate S. The illuminating devices 62a and 62b may be turned on before or after they are rotated to the imaging position. Alternatively, the illuminating devices 62a and 62b may be turned on at all times. To put it another way, step S20 may precede step S30 or S20 may precede step S30 or they may take place at the same time. Control of the illuminating devices 62a and 62b and the rotating devices 63a and 63b may be carried out by the controller 175 and the controller 60a or by the controller 60a alone.

Step S40 uses the image sensors 61a and 61b to take images of the corners P1 and P3 of the substrate S and obtain image data on two adjacent sides at the corners P1 and P3. The image data includes the direction on the x-y plane of the straight segments of the two adjacent sides L1-L4, L2-L3 and a set of coordinates of points constituting the straight segments of the two adjacent sides. From the image data on the two adjacent sides at each corner is calculated the intersection of the two adjacent sides as the positions (x1, y1), (x3, y3) of the corners P1, P3. In doing so, a process of extending the straight segment of each side is carried out, as required. Then the central position ($x_0$, $y_0$) is calculated as the midpoint of the diagonal connecting the positions (x1, y1) and (x3, y3) of the corners P1 and P3. Of the image data on the two adjacent sides at each corner, the angle of the side L4 and/or side L2 inclined relative to the x-axis is calculated as the rotational angle θ. For example, the angle of incline of the side L4 relative to the x-axis is calculated as the rotational angle θ (FIG. 12). Alternatively, the angle of the side L4 rotated from the x-axis and the angle of the side L2 rotated from the x axis may be averaged to yield the rotational angle θ of the substrate S. The angle of incline of the sides L1 and L3 relative to the y-axis may be calculated as the rotational angle θ. Alternatively, the average of the angle of incline of the side L4 and side L2 relative to the x-axis and the angle of incline of the sides L1 and L3 relative to the y-axis may be calculated as the rotational angle θ. In this case, the directions of measurement of angles of incline relative to the x-axis and the y-axis are set the same.

Step S40 calculates the difference between the central position ($x_0$, $y_0$)/rotational angle θ of the substrate S calculated and the target central angle ($x_t$,$y_t$)/target rotational angle $θ_0$=0. The image sensors 61a and 61b while taking images are controlled by the controllers 175 and 60a or by the controller 60a alone. The calculation is carried out by the image sensors 61a and 61b, the controller 60a, and/or the controller 175.

Step S50 determines whether the difference between the central position ($x_0$, $y_0$) and rotational angle θ of the substrate S calculated, and the target central angle ($x_t$,$y_t$) and the target rotational angle $θ_0$=0 is within a predetermined range. More specifically, it is determined whether the difference is both greater than or equal to a first predetermined value and less than or equal to a second predetermined value (the absolute values of the first and second predetermined values may be the same or different) or whether the absolute value of the difference is less than or equal to a predetermined value. This determination is made by the controller 175 or the controller 60a.

If the difference is within the predetermined range, the process will proceed to step S60. Step S60 uses the rotating devices 63a and 63b to rotate the illuminating devices 62a and 62b to the retracted position. Subsequently, the substrate S is moved down by the robot hand 272 onto the second holding member 400.

If the difference is outside the predetermined range, the process will proceed to step S70. In step S70, the robot hand 272 is moved, based on the measured difference, to correct the position of the substrate S to bring the central position and the rotational angle of the substrate S close to the target central position and the target rotational angle. Then the process will return to step S40 to repeat steps S40, S50, and S70 until in step 50 the difference in the position of the substrate S is determined to be within the predetermined range.

Upon determining in step S50 that the difference in position of the substrate S is within the predetermined range, step S60 uses the rotating devices 63a and 63b to rotate the illuminating devices 62a and 62b to the retracted position and then uses the robot hand 272 to move the substrate S down onto the second holding member 400. The illuminating devices 62a and 62b may be turned off at any desired time after the difference in position of the substrate S is determined in step S50 to be within the predetermined range.

After the substrate S is placed on the second holding member 400, a securing member (not shown) on the second holding member 40 is used to secure the substrate S to the second holding member 400, and the support plate 1210 of the rotating device 1200 is swung by 90 degrees into vertical direction. Subsequently, the rotating device 1200 moves ahead toward the first holding member held vertically on an unillustrated holder station and presses the second holding member 400 against the first holding member, such that the second holding member 400 is fixed to the first holding member by an unillustrated clamp. As a result, the substrate S is securely held between the second holding member 400 and the first holding member of the substrate holder 11.

This substrate position adjustment process places the substrate S at the proper position on the second holding member 400, based on the positions of two corners on a diagonal line of the substrate S, even if there are tolerances on the dimensions of substrates. Since images of two adjacent sides at two corners on a diagonal line of the substrate S are taken to measure and correct the central position and the rotational angle of the substrate S, positioning can be achieved with improved accuracy.

While the substrate S is illuminated by the illuminating device 62 on one side of the substrate S, the positions of corners of the substrate are detected by the image sensor 61 on the opposite side of the substrate S. This enhances the contrast between the substrate S and its background, making it possible to detect the boundary of the substrate S clearly. This in turn further improves the accuracy in detection of the position of the substrate S.

Calculating the central position and the rotational angle of the substrate S on the basis of image data on straight segments of two adjacent sides at the corners of the substrate S makes it possible to determine the position of the corner accurately and calculate the central position precisely even if the corner of the substrate S is rounded or the apex is obscure.

Second Embodiment

Figure 9:
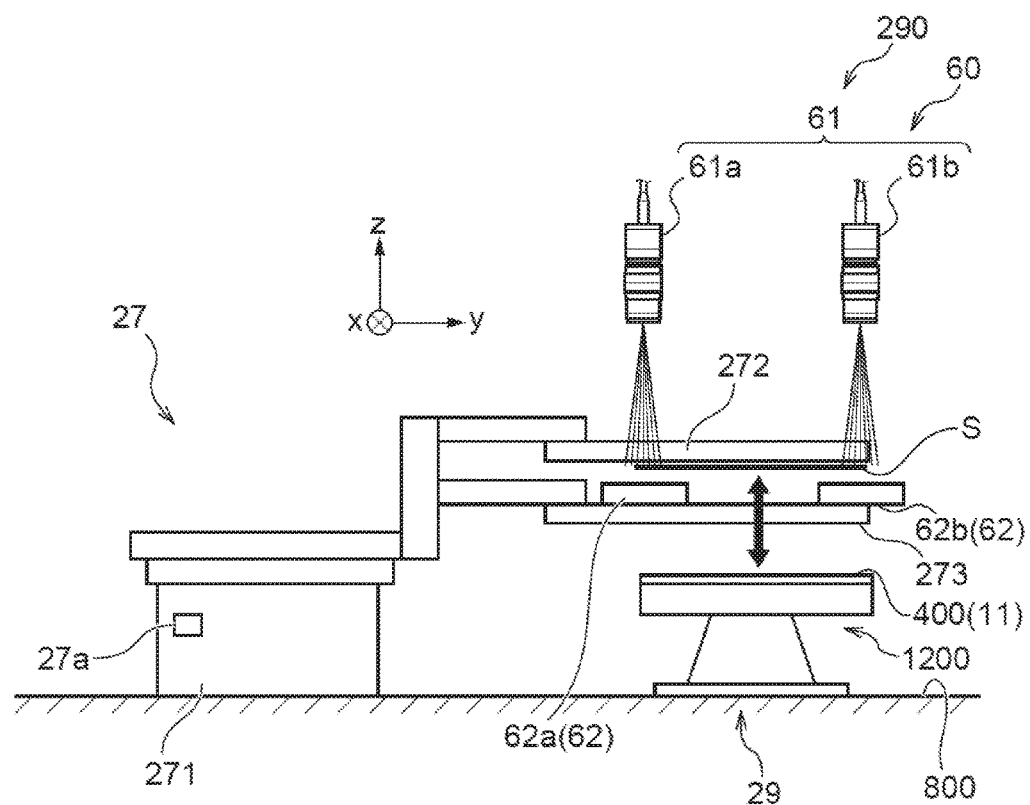
FIG. 9 is a schematic view of a substrate position detector according to a second embodiment.
Figure 10:
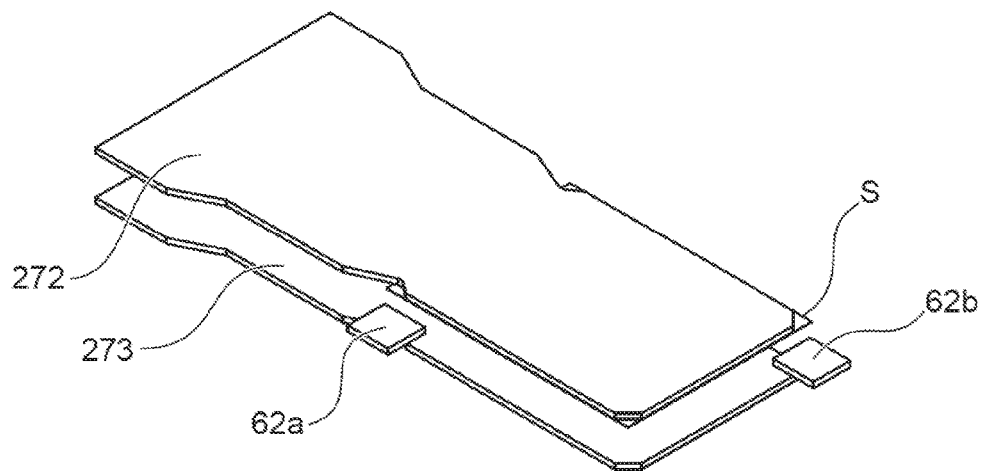
FIG. 10 is a perspective view of a structure for mounting the illuminating device according to the second embodiment.

FIG. 9 is a schematic view of a substrate position detector according to the second embodiment. FIG. 10 is a perspective view of how illuminating devices of the second embodiment are mounted. In the previous embodiment, the illuminating devices 62a and 62b are disposed on the substrate mounting/dismounting section 29. In this embodiment, the illuminating devices 62a and 62b are disposed on the substrate transfer device 270 (transfer robot 27). Below, the elements the same as those of the first embodiment are denoted by the same reference numerals and redundant description is omitted.

In this embodiment, the transfer robot 27 comprises the robot hand 272 and a robot hand 273. The robot hand 272 is a so-called dry hand for transferring the substrate S before being processed. Since this robot hand 272 is the same as that of the first embodiment, its description is omitted. The robot hand 273 is a so-called wet hand for transferring the processed substrate S before it is washed and dried. Since plating solution or cleaning liquid may drop from the substrate S after being plated, the robot hand 273 is disposed below the robot hand 272 to prevent contamination of the robot hand 272.

As with the robot hand 272, the robot hand 273 holds the substrate S on its bottom surface. The way to hold substrates is the same as that with the robot hand 273: the substrate S is held with or without contact. As shown in FIG. 10, the illuminating devices 62a and 62b are attached to the top surface opposite to the bottom surface on which the substrate S is held. The illuminating devices 62a and 62b are attached to positions corresponding to the two corners P3 and P1 (FIG. 11) on a diagonal line of the substrate S. When the robot hand 272 has moved the substrate S to directly above the target mounting position on the second holding member 400, as described in the first embodiment, the robot hand 273 (preferably when not holding the substrate S) is disposed below the robot hand 272. At this stage, the illuminating devices 62a and 62b are positioned below the two corners P3 and P1 on a diagonal line of the substrate S and are opposed to the image sensors 61 and 61b. In other words, the illuminating devices 62a and 62b are moved by the robot hand 273 to the same imaging position as that of the first embodiment. At this stage, while the illuminating devices 62a and 62b illuminate the corners P1 and P3 of the substrate S, the image sensors 61a and 61b take images of the corners P1 and P3 of the substrate. After the substrate S is set in position, the illuminating devices 62a and 62b are moved by the robot hand 273 to the retracted position. In this embodiment, the movement of the illuminating devices 62a and 62b is made by the robot hand 273 and is controlled by the controller 175 and/or the controller 27a. The robot hand 272 may be moved before the robot hand 273 or the robot hand 273 may be moved before the robot hand 272 or the robot hands 272 and 273 may be moved at the same time.

Although the manner in which the illuminating devices 62a and 62b are mounted and the manner in which they are moved to the imaging position are different, other structural and control details are the same as those of the first embodiment. The control of the second embodiment is the same as that of the first embodiment except that step S20 in the flowchart of FIG. 8 uses the robot hand 273 to move the illuminating devices 62a and 62b to the imaging position, that step S30 uses the controller 27a of the transfer robot 27 to turn on the illuminating devices 62a and 62b, and that step S60 uses the robot hand 273 to move the illuminating devices 62a and 62b to the retracted position.

In this embodiment, the substrate mounting/dismounting section 29 is not provided therein with the illuminating devices 62a, 62b, the rotating devices 63a, 63b, or the mounting members 74a, 74b on which they would be mounted, resulting in economy of space in the substrate mounting/dismounting section 29. Since the illuminating devices are mounted on robot hands that inherently have moving function, the rotating devices 63a and 63b can be omitted that would otherwise move the illuminating devices 62a and 62b between the imaging position and the retracting position.

Other Embodiments

Modified Example 1

In the above embodiments, the image sensors 61a and 61b are disposed at the two corners P1 and P3 on a diagonal line of the substrate S; however, such imaging sensors may be disposed at positions to capture images of three or more corners, one at each corner. In this case, the same number of illuminating devices corresponds to that of imaging sensors. Providing three or more imaging sensors in this manner will further improve the accuracy in detecting the position of the substrate S. For example, in FIG. 11, the positions of three corners P1 to P3 are determined and the triangle connecting the corners P1, P2, and P3 is calculated. In this way, the position of the corner P4 can be calculated by symmetrically flipping the triangle over with respect to its hypotenuse. Then the position of the center P0 can be determined from the intersection of the diagonal between the corners P1 and P3 and the diagonal between the corners P2 and P4. This improves the accuracy in measurement of the central position. In addition, for example, in FIG. 11, the positions of the four corners P1 to P4 are determined and the position of the center P0 is calculated from the intersection of the diagonal between the corners P1 and P3 and the diagonal between the corners P2 and P4. This further improves the accuracy in center position measurement.

In the case where the midpoint of the diagonal segment between the corners P1 and P3 differs from the midpoint of the diagonal segment between the corners P2 and P4 by a distance greater than a predetermined value, provision may be made to determine that there is a possibility of the substrate S being warped or deflected when it is placed on the second holding member 400 or a possibility of an error in the dimensions of the substrate. In this case, provision may be made for the robot hand 272 to hold a substrate S again and subsequently re-place it on the second holding member 400.

Modified Example 2

In the above embodiments, positioning is carried out while the substrate S and the second holding member 400 are in horizontal position. Alternatively, with the substrate S and the second holding member 400 in vertical position, positioning may be carried out in a similar manner. For example, the image sensors and illuminating devices may be placed on the horizontally opposite sides of the substrate S placed in vertical position to take images of corners of the substrate S, using the image sensors, while the corners are illuminated. In the above embodiment, the substrate S is placed from above the substrate holder. Alternatively, the present invention may also be applied in such a manner that the substrate S is placed from below the substrate holder. In this case, the image sensors are disposed below the substrate, and the illuminating devices are placed above the substrate so that they are located between the substrate and the substrate holder.

Modified Example 3

In the above embodiments, the substrate is aligned to the substrate holder (second holding member) in the substrate mounting/dismounting section. However, these embodiments may be used in aligning the substrate to any desired member or device. It is possible to align and place the substrate, for example to a table for temporary placement, a processing table, or the like of any desired substrate processing device such as a plating device, a polishing device, a grinding device, a coating device, or an etching device. The present invention can also be employed in aligning the substrate to a plate in a grinding device for grinding and/or polishing substrates under a work unit condition with the substrate secured to the plate.

Modified Example 4

The above embodiments are described with an example of rectangular substrates. Instead, square or other polygonal substrates, such as pentagonal and hexagonal, may be used. Alternatively, the substrates may be disk-shaped. One conceivable way of identifying the position of a disk substrate is to measure, for example, the profile of a notch position on the substrate, the profile of outer circumferences at opposite positions of the center, and the profile of outer circumferences at two opposite positions of the substrate center crossing that line at right angles. Alternatively, image sensors and illuminating devices disposed on the opposite sides of a substrate may be used as in the above embodiments to detect the profile of the substrate of any shape with improved accuracy. In the case of a four-sided substrate, its center is used as a reference position, but in the case of other polygonal substrates, it is possible to calculate the position of two corners that are not adjacent and use the midpoint of the line connecting the corners as a reference position on the substrate. The rotational angle of the substrate is defined by the incline of one of two adjacent sides relative to a predetermined direction. In the case of polygons having an even number of sides, such as a hexagon, two corners that are farthest apart from each other may be selected so as to calculate at least one diagonal line therebetween (the longest diagonal line), such that the midpoint of this diagonal line can be used as the center of the substrate, as described in the first and second embodiments. It is possible to calculate the rotational angle from the incline of at least one of the two adjacent sides at a corner.

From the above-described embodiments, at least following technical concepts can be recognized.

[1] A first aspect provides a substrate processing device for processing substrates, which comprises: at least one image sensor for detecting the positions of two corners on at least one diagonal line of substrate when it is moved to a predetermined position; at least one illuminating device that can be positioned on an opposite side of the substrate at the predetermined position to the at least one image sensor, so as to illuminate the two corners of the substrate; and a control device (control circuit) designed to determine the position of the substrate, based on the positions of the two corners detected by the at least one image sensor. The control device may comprise a single controller or a plurality of controllers that operate in cooperation.

According to the first aspect, the positions of the corners of the substrate are detected while the substrate is being illuminated by the at least one illuminating device on the opposite side to the at least one image sensor. This makes it possible to enhance the contrast between the substrate and its background and detect the boundary between the substrate and its background (the profile of the substrate) more definitely. This enables the corners of the substrate to be detected with improved accuracy and the position of the center of the substrate to be calculated with improved accuracy. In the case where a deviation in the position of the substrate is detected by diagnosis of an image of the substrate and the substrate holder captured by the at least one image sensor, and the substrate and its background (e.g., the mounting surface of the substrate holder) are of the same color, it may be difficult to determine the boundary between the substrate and the background. According to the first aspect, however, the contrast between the substrate and the background is enhanced by the at least one illuminating device, making the boundary more definite without being affected by the substrate material and the substrate pattern.

When there are tolerances on the dimensions of substrates, the position of a substrate edge varies. However, since the position of the substrate is determined from the positions of two corners on at least one diagonal line of the substrate, the position of the substrate can be determined accurately even when there are tolerances on the dimensions of the substrate.

[2] According to a second aspect, in the substrate processing device of the first aspect, the predetermined position is a position of holding the substrate provided on a substrate holding member for holding substrates. The substrate holding member comprises a substrate holder, a table for temporary mounting, and a processing table.

The second aspect enables the position of the substrate relative to the substrate holding member, such as the substrate holder or the table for temporary mounting, to be determined accurately.

[3] According to a third aspect, in the substrate processing device of the first or second aspect, the at least one image sensor detects two adjacent sides of the substrate and the control device calculates the position of the intersection of the two sides as the position of the corner.

The third aspect enables the position of the corner of the substrate to be detected accurately by determining the position of the intersection of the two adjacent sides. In particular, even if the apex of the corner of the substrate is obscure or the corner is rounded, the position of the corner of the substrate can be detected accurately.

[4] According to a fourth aspect, in the substrate processing device of any one of the first to third aspects, the control device calculates the central position of the substrate and its rotational angle as the position of the substrate.

According the fourth aspect, the central position of the substrate is determined from the positions of two corners on at least one diagonal line. A rotational angle of the substrate can be determined relative to a predetermined direction on the basis of at least one of two sides adjacent to a corner, the position of which sides have been detected. This enables the position of the substrate to be determined more accurately from the central position and rotational angle of the substrate. This measurement of the central position and the rotational angle of the substrate makes it possible to determine the position of the substrate with improved accuracy, for example even if there are tolerances on the dimensions of substrates.

[5] According to a fifth aspect, in the substrate processing device of any one of the first to fourth aspects, the position of the corner is the position of an apex of the substrate and the center of the image sensor corresponds to a position on the inside of the substrate, inward of the position of the apex.

The fifth aspect enables a wider range of the substrate at the corner to be captured by the image sensor, making it possible to calculate the position of the corner with improved accuracy. Since, for example, an image of a wider range of two sides adjacent to a corner can be captured by the image sensor, the position of the corner and the rotational angle can be calculated with improved accuracy.

[6] According to a sixth aspect, in the substrate processing device of any one of the first to fifth aspects, the control device determines whether the position of the substrate calculated is within a predetermined range and, if not, corrects the position of the substrate.

The sixth aspect enables the position of each substrate to be corrected accurately on the basis of the positions of two corners on at least one diagonal line of the substrate, even if there are tolerances on the dimensions of the substrate.

[7] According to a seventh aspect, in the substrate processing device of any one of the first to sixth aspects, the at least one image sensor measures the position of the substrate, when the substrate is at a position adjacent to the top, bottom, or a lateral side of a substrate holder serving as a substrate holding member disposed on a substrate mounting/dismounting device, the position of the substrate is measured, and the control device aligns the substrate to the substrate holder, based on a result of measurement taken by the at least one image sensor, and subsequently places the substrate on the substrate holder According to the seventh embodiment, since the position of the substrate is measured at a position adjacent to the substrate holder by the at least one image sensor, the position of the substrate relative to the substrate holder can be corrected, as required, when positioning the substrate before it is mounted on the substrate holder. This enables the substrate to be positioned accurately relative to the substrate holder.

[8] According to an eight aspect, in the substrate processing device of the seventh aspect, the at least one illuminating device is movable between an imaging position between the substrate and the substrate holder, which position is opposed to the at least one image sensor, and a retracted position where the at least one illuminating device is retracted from between the substrate and the substrate holder.

The eighth aspect enables the substrate to be mounted on the substrate holder, with the at least one illuminating device retracted after positioning of the substrate with the at least one image sensor and the at least one illuminating device. This prevents interference between the substrate and the at least one illuminating device.

[9] According to a ninth aspect, the substrate processing device of any one of the first to eight aspects further comprises a transfer robot serving as a device for transferring the substrate to the predetermined position and holding the substrate, the transfer robot having a first hand for transferring the substrate to the predetermined position and holding the substrate and a second hand provided with the at least one illuminating device.

According to the ninth aspect, since the at least one illuminating device is provided on the second hand of the transfer robot, a smaller number of illuminating devices are required than when each substrate holder is provided with an illuminating device. It is also possible to reduce modifications to the design of other portions such as a substrate mounting/dismounting section. With the illuminating device placed on the opposite side of the second hand to the substrate holding side, it is possible to minimize an adverse effect on the second hand's capability of transferring substrates. The first and second hands may be, for example, a so-called dry hand for transferring substrates before being processed and a so-called wet hand for transferring substrates before being cleaned and dried after substrate processing.

[10] According to a tenth aspect, in the substrate processing device of any of the first to ninth aspect, the at least one image sensor comprises a first and a second image sensor located at positions so as to take images of the two respective corners.

Since the tenth aspect uses the first and second image sensors at positions to image the respective corners, it is possible to suppress the dimensions of the substrate from adversely affecting the dimensions of the image sensors. Further, the position of each corner can be detected by the respective image sensor with improved accuracy.

[11] According to an eleventh aspect, in the substrate processing device of any of the first to tenth aspects, the at least one illuminating device comprises a first and a second illuminating device located at positions to illuminate the respective two corners.

According to the eleventh aspect, with the first and second illuminating devices located at positions to illuminate the respective corners, it is possible to suppress the dimensions of the substrate from adversely affecting the dimensions of the illuminating devices. Further, since it is possible to suppress light from propagating to an area other than the area required for position detection, the effect of illumination on the substrate can be reduced. Further, the corners can be efficiently illuminated by the respective illuminating devices.

[12] A twelfth aspect provides a method for controlling a substrate processing device for processing substrates. This control method comprises: detecting the positions of two corners on at least one diagonal line of a substrate when the substrate is moved to a predetermined position, using at least one image sensor located on a second side of the substrate, while the substrate is being illuminated by the at least one illuminating device on a first side of the substrate; and determining the position of the substrate on the basis of the positions of the two corners detected by the at least one image sensor. The twelfth aspect brings about similar effects to the first aspect.

[13] A thirteenth aspect provides a storage medium storing a program for executing the method of controlling the substrate processing device on a computer. This storage medium stores a program to be executed on the computer to detect the positions of two corners on at least one diagonal line of a substrate when the substrate is moved to a predetermined position, using at least one image sensor located on a second side of the substrate, while the substrate is being illuminated by the at least one illuminating device on a first side of the substrate, and to determine the position of the substrate on the basis of the positions of the two corners detected by the at least one image sensor. The thirteenth aspect brings about similar effects to the first aspect.

The embodiments of the present invention described above on the basis of some examples are intended to facilitate understanding of the present invention and not to limit the present invention. Various modifications and improvements are possible without departing the spirit of the present invention, and the scope of the present invention encompasses its equivalents. For example, the plating device of any of the above embodiments may be modified so that after a substrate is placed on the second holding member 400, the first holding member is brought toward the substrate without changing the posture of the substrate, so as to hold the substrate between the first and second holding members. Provided that the above-described problem can be solved at least to some extent or that the effect can be achieved at least in part, it is possible to combine the constituent elements recited in the claims and the specification in any way or to omit some of them.

The present application claims priority to Japanese Patent Applications No. 2017-067804 filed on Mar. 30, 2017. The entire disclosure of Japanese Patent Applications No. 2017-067804 filed on Mar. 30, 2017, including specification, claims, drawings and summary is incorporated herein by reference in its entirety.

The entire disclosure of Japanese Patent No. 5750327 (Patent Literature 1), including specification, claims, drawings and summary is incorporated herein by reference in its entirety.

REFERENCE NUMERALS

11. substrate holder
25. cassette table
25*a*. cassette
27. robot
27*a*. controller
270. substrate transfer device
28. drive mechanism
29. substrate mounting/dismounting device
290. substrate mounting/dismounting section
30. stocker
32. pre-wet tank
33. pre-soak tank 34. pre-rinse tank
35. blow tank
36. rinse tank
37. substrate holder transfer device
38. overflow tank
39. plating tank
50. cleaning device
50a. cleaning section
60. substrate position detector
61, 61a, 61b. image sensors
62, 62a, 62b. illuminating devices
63a, 63b. rotating devices
64a, 64b. arms
70. frame
71. mounting structure
72, 73, 74a, 74b. mounting members
100. substrate processing device
110. unloading section
120. processing section
120A. pre-processing/post-processing subsection
120B. processing subsection
175. controller
175A. CPU
175B. memory
175C. control section
271. robot body
272, 273. robot hands
300. first holding member
400. second holding member
800. mounting plane
1210. support plate
1200. rotating device

What is claimed is:

1. A substrate processing device for processing a substrate, comprising:
    at least one image sensor for detecting positions of two corners on at least one diagonal line of a substrate when the substrate is moved to a predetermined position;
    at least one illuminating device that can be disposed so as to illuminate the two corners of the substrate on an opposite side of the substrate at the predetermined position to the at least one image sensor; and
    a control device designed to determine the position of the substrate, based on the positions of the two corners detected by the at least one image sensor.

2. A substrate processing device according to claim 1, wherein the predetermined position is a position of holding a substrate provided on a substrate holding member for holding a substrate.

3. A substrate processing device according to claim 1, wherein the at least one image sensor detects two adjacent sides of the substrate and the control device calculates a position of an intersection of the two sides as a position of the corner.

4. A substrate processing device according to claim 1, wherein the control device calculates a central position and a rotational angle of the substrate as a position of the substrate.

5. A substrate processing device according to claim 1, wherein:
    the position of the corner is a position of an apex of the substrate; and
    a center of the image sensor corresponds to a position on the substrate inward of the position of the apex.

6. A substrate processing device according to claim 1, wherein the control device determines whether the position of the substrate calculated is within a predetermined range and corrects the position of the substrate if the position of the substrate is not within the predetermined range.

7. A substrate processing device according to claim 1, wherein:
    the at least one image sensor measures the position of the substrate when the substrate is at a position adjacent to a top, a bottom or a side of a substrate holder serving as a substrate holding member, disposed on a substrate mounting/dismounting device provided in a substrate mounting/dismounting section; and
    the control device aligns the substrate to the substrate holder, based on a result of measurement taken by the at least one image sensor, and subsequently places the substrate on the substrate holder.

8. A substrate processing device according to claim 7, wherein the at least one illuminating device is movable between an imaging position between the substrate and the substrate holder, which position is opposed to the at least one imaging sensor, and a retracted position where the at least one illuminating device is retracted from between the substrate and the substrate holder.

9. A substrate processing device according to claim 1, further comprising a transfer robot serving as a transfer device for transferring the substrate to the predetermined position and holding the substrate, wherein
    the transfer robot comprises a first hand for transferring the substrate to the predetermined position and holding the substrate and a second hand on which the at least one illuminating device is provided.

10. A substrate processing device according to claim 1, wherein the at least one imaging sensor comprises a first and a second image sensor provided at respective positions so as to take images of the two corners.

11. A substrate processing device according to claim 1, wherein the at least one illuminating device comprises a first and a second illuminating device provided at respective positions so as to illuminate the two corners.

12. A method for controlling a substrate processing device for processing a substrate, comprising:
    detecting positions of two corners on at least one diagonal line of a substrate when the substrate is moved to a predetermined position, while the substrate is being illuminated by at least one illuminating device on a first surface side of the substrate, using at least one image sensor on a second surface side of the substrate; and
    determining a position of the substrate, based on the positions of the two corners detected by the at least one image sensor.

13. A storage medium storing a program for executing a method for controlling a substrate processing device on a computer to:
    detect positions of two corners on at least one diagonal line of a substrate when the substrate is moved to a predetermined position, while the substrate is being illuminated by at least one illuminating device on a first surface side of the substrate, using at least one image sensor on a second surface side of the substrate; and
    determine a position of the substrate, based on the positions of the two corners detected by the at least one image sensor.

* * * * *